(12) United States Patent
Khan et al.

(10) Patent No.: US 11,927,610 B2
(45) Date of Patent: Mar. 12, 2024

(54) DETECTION OF RINGDOWN FOR ELECTROMECHANICAL MODE IDENTIFICATION IN ONLINE ENVIRONMENT

(71) Applicant: Schweitzer Engineering Laboratories, Inc., Pullman, WA (US)

(72) Inventors: Md Arif Khan, Pullman, WA (US); Riley Grant Huddleston, Moscow, ID (US); Gregary C. Zweigle, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 42 days.

(21) Appl. No.: 17/378,249

(22) Filed: Jul. 16, 2021

(65) Prior Publication Data

US 2023/0015611 A1    Jan. 19, 2023

(51) Int. Cl.
G01R 19/25    (2006.01)
G01R 21/133    (2006.01)

(52) U.S. Cl.
CPC ....... G01R 19/2513 (2013.01); G01R 21/133 (2013.01)

(58) Field of Classification Search
CPC .......................... G01R 19/2513; G01R 21/133
See application file for complete search history.

(56) References Cited

U.S. PATENT DOCUMENTS

| | | |
|---|---|---|
| 8,498,832 B2 | 7/2013 | Venkatasubramanian |
| 9,293,949 B2 * | 3/2016 | Trudnowski ...... H02J 13/00002 |
| 9,568,513 B2 | 2/2017 | Venkatasubramanian |

OTHER PUBLICATIONS

Tashman et al., "Modal Energy Trending for Ringdown Analysis in Power Systems using Synchrophasors,", 2014 47th Hawaii International Conference on System Science.*
Zhou et al., "Automatic Implementation of Prony Analysis for Electromechanical Mode Identification from Phasor Measurements", IEEE, 2010.*
Zhou, Ning; Huang, Zhenyu; Tuffner, Fancis; Pierre, John; Jin, Shuangshuang: "Automatic Implementation of Prony Analysis for Electromechanical Mode Identification from Phasor Measurements" 2010.

* cited by examiner

*Primary Examiner* — Andrew Schechter
*Assistant Examiner* — Jeremy A Delozier
(74) *Attorney, Agent, or Firm* — Bradley W. Schield; Richard M. Edge (57) ABSTRACT

A system includes a processor operatively coupled to memory. The processor performs operations that include obtaining electrical measurements of a power system. The processor determines a scaled energy value of a first set of the electrical measurements that are scaled with respect to a second set of electrical measurements. The processor determines that a potential ringdown event occurred by comparing the scaled energy value to a threshold energy value. The processor determines that the potential ringdown event is a confirmed ringdown event by comparing a scaled error value to a threshold error value. The processor generates one or more mode estimates from the confirmed ringdown event.

20 Claims, 6 Drawing Sheets

DETECTION OF RINGDOWN FOR ELECTROMECHANICAL MODE IDENTIFICATION IN ONLINE ENVIRONMENT

BACKGROUND

The present disclosure generally relates to ringdown in power systems, and, more particularly, to detection of ringdown events appropriate for ringdown modal analysis.

DRAWINGS

These and other features, aspects, and advantages of the present disclosure will become better understood when the following detail description is read with reference to the accompanying drawings in which like characters represent like parts throughout the drawings, wherein.

DETAILED DESCRIPTION

Ringdown analysis may be used to estimate the electromechanical modes of a power system. The electromechanical modes of the power system may include electrical characteristics of the power system, such as amplitude, frequency, and damping. Damping of the power system may indicate how the power system responds to a disturbance on the power system. Depending on the disturbance and how the system responds, operators may take different corrective actions to ensure the stability of the power system, thereby reducing black outs and/or preventing cascading failures on the power system.

Some methods of ringdown analysis may be difficult to apply in online, real-time settings. One technique to apply ringdown analysis in an online environment may involve using a sliding window approach. However, such approaches may provide misleading or inaccurate results when applied to measurements that do not contain an adequate ringdown response. Accordingly, there is a need in the field to identify appropriate data for ringdown analysis.

As explained below, a monitoring device, such as an intelligent electronic device (IED) may obtain electrical measurements of a power system. The IED may determine a scaled energy value of a first set of the electrical measurements that is scaled with respect to a second set of electrical measurements. The IED may select electrical measurements appropriate for ringdown analysis by determining whether a potential ringdown event occurred from comparing the scaled energy value to a threshold energy value. Upon selecting a set of measurements that indicate a potential ringdown event likely occurred, the IED may confirm the ringdown event by comparing a scaled error value to a threshold error value. The scaled error value may be obtained by comparing the electrical measurements to a ringdown model. When the difference (i.e., error) between the electrical measurements and the model falls below the threshold error value, the IED may confirm that a ringdown event has likely occurred. The IED may generate one or more mode estimates from the confirmed ringdown event and communicate the one or more mode estimates. By identifying potential ringdown events that are suitable for ringdown modal analysis, accuracy in detection of ringdown events may be improved, thereby reducing or eliminating erroneous estimates.

Figure 1:
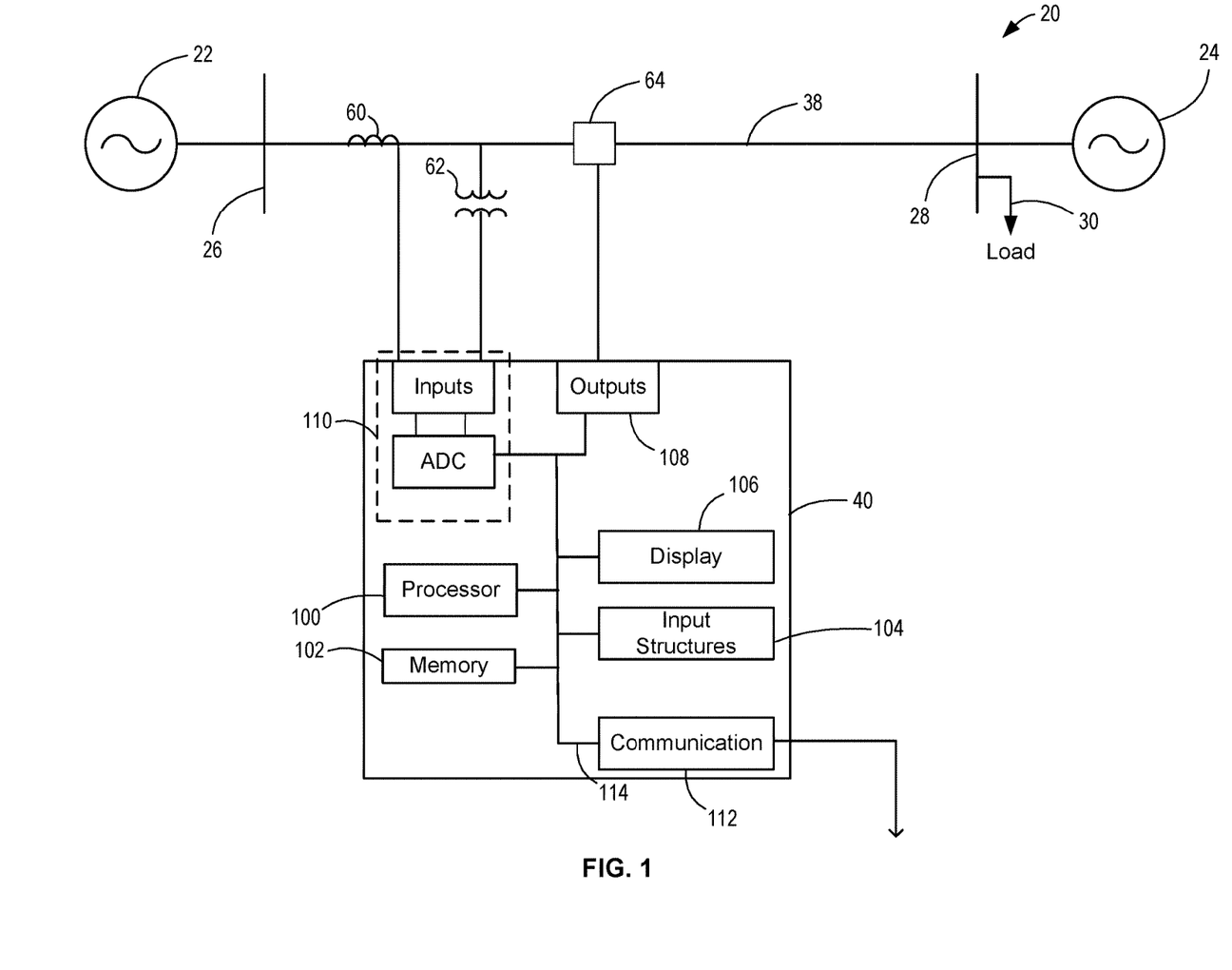
FIG. 1 illustrates a block diagram of a power system that includes an intelligent electronic device (IED) that monitors the power system to detect ringdown events, in accordance with an embodiment.

FIG. 1 illustrates a block diagram of an embodiment of an electric power delivery system 20, which may have various electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment. For illustrative purposes, the electric power delivery system includes a first power source 22 and a second power source 24 and buses 26 and 28. The buses 26 and 28 may include one or more loads (e.g., load 30) that consume power from the first power source 22 and/or the second power source 24. The electric power delivery system 20 includes a power line 38 that is communicatively coupled between the first power source 22 and the second power source 24 to deliver power, from the power sources 22 and 24, to the loads on the buses 26 and 28. Although illustrated in single-line form for purposes of simplicity, the electric power delivery system 20 may be a multi-phase system, such as a three-phase electric power delivery system.

The electric power delivery system 20 may be monitored, controlled, and protected by one or more intelligent electronic devices (IEDs). As used herein, an IED (such as IED 40) may refer to any microprocessor-based device that monitors, controls, automates, and/or protects monitored equipment within the power system 20. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. The IED 40 may obtain electric measurements (e.g., current and/or voltage measurements) via analog signals from sensors, such as current transformers (CTs) 60, potential transformers (PTs) 62, Rogowski coils, voltage dividers, or the like. In other embodiments, the IED 40 may obtain digitized analog signals from merging units, which obtain electrical signals from the power system and communicate the digitized analog signals to the IED 40.

The IED 40 may be communicatively connected to a circuit breaker (CB) 64 to perform protection and/or control operations on the power system 20. If an event, such as a fault, were to occur on the power line 38 monitored by the IED 40, the IED 40 may send a signal to trip the CB 64 to disconnect the load 30 from the generator 22. For example, the IED 40 may use overcurrent, time-overcurrent, or other forms of fault detection to detect the fault due to the power source 22 providing energy to the fault.

In the illustrated embodiment, the IED includes a processor 100, a computer-readable storage medium 102, input structures 104, a display 106, output circuitry 108, sensor circuitry 110, and communication circuitry 112. The CBC 40 may include one or more bus(es) 114 connecting the processor 100 or processing unit(s) to the computer-readable storage medium 102, the input structures 104, the display 106, the output circuitry 108, the sensor circuitry 110, and/or the communication circuitry 112. The computer-readable storage medium 102 be embodied as memory, such as random access memory (RAM), read only memory (ROM), or a combination thereof, and may include or interface with software, hardware, or firmware modules for implementing various portions of the systems and methods described herein. The computer-readable storage medium 102 may be the repository of one or more modules and/or executable instructions configured to implement any of the processes described herein.

The processor 100 may process inputs received via the sensor circuitry 110 and the communication circuitry 112. The processor 100 may operate using any number of processing rates and architectures. The processor 100 may be configured to perform various algorithms and calculations described herein using computer executable instructions stored on computer-readable storage medium 102. The processor 100 may be embodied as a microprocessor. In certain embodiments, the processor 100 and/or the computer-readable storage medium 102 may be embodied as discrete electrical components, a general purpose integrated circuit, one or more Application Specific Integrated Circuits ("ASICs"), a Field Programmable Gate Array ("FPGA"), and/or other programmable logic devices. The processor 100 and/or the computer-readable storage medium 102 may be referred to generally as processing circuitry.

As illustrated, the sensor circuitry 110 may include, for example, input pins or connectors that receive voltage signal(s) from voltage sensors, such as the PT 62 and current signals(s) from current sensors, such as the CT 60. The sensor circuitry 110 may transform the current and voltage signals conversion circuits to a level that may be measured (e.g., via internal transformers), and sample the signals using, for example, A/D converter(s) to produce digital signals representative of measured voltage and measured current on the power line 38. The A/D converter may be connected to the processor 100 by way of the bus 114, through which digitized representations of voltage signals may be transmitted to the processor 100. The processor 100 may use the voltage measurements and current measurements to perform monitoring, control, and/or protection operations, such as opening the circuit breaker 64.

The communication circuitry 112 may include communication ports, such as ethernet and serial ports, transceivers, and the like. The IED 40 may include a display screen 106 that displays information to notify an operator of operating parameters of the electric power delivery system 20, such as current measurements, voltage measurements, capacitor bank status, power flow direction, etc. The input structures 104 may include buttons, controls, universal serial bus (USB) ports, or the like, to allow a user to provide input settings to the IED 40. In some embodiments, the display 106 may be a touchscreen display.

The output circuitry 108 may include one or more output pins or connectors that electrically connect the IED 40 to the CB 64 to allow the processor 100 to send control signals to control operation of the CB 64.

While the IED 40 described in FIG. 1 may be a protection device, such as a protective relay, in other embodiments, the IED 40 may be part of a monitoring system or a control system. In some embodiments, the IED 40 may communicate monitoring, control, or protection data, via a supervisory control and data acquisition system (SCADA) system, to allow for monitoring of the power system at a central monitoring station.

Figure 2:
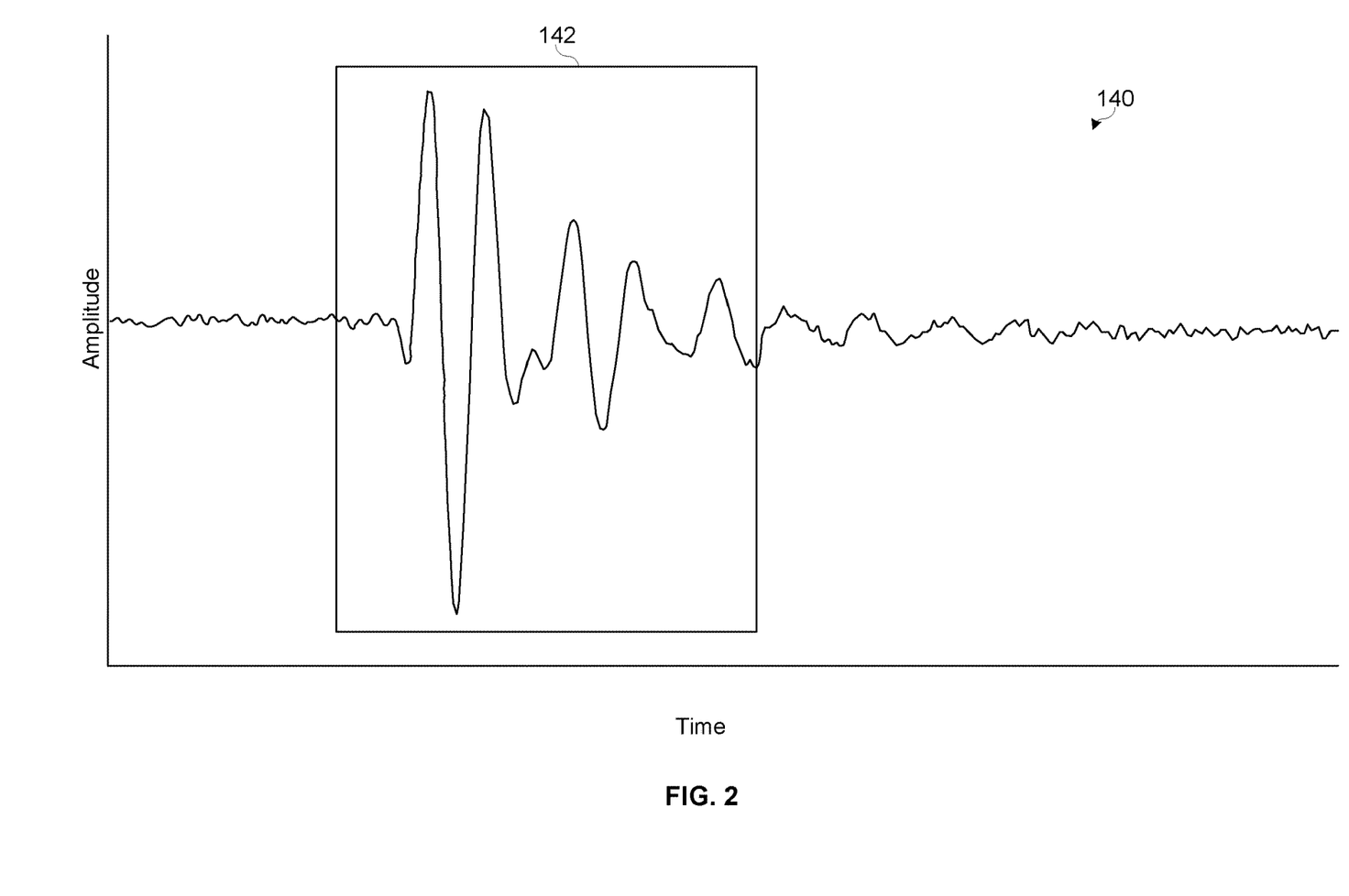
FIG. 2 is a plot of electrical measurements of a ringdown event that may occur in the power system of FIG. 1, in accordance with an embodiment.

FIG. 2 is a plot 140 of electrical measurements that may be obtained by the IED 40 during a ringdown event. The electrical measurements may be synchrophasor measurements, such as voltage measurements and/or current measurements that include magnitude and phase angle of the voltage and/or current. Ringdown analysis may be performed using a set of synchrophasor measurements obtained within a measurement window 142 of time to estimate the electromechanical modes of the power system 20. Electromechanical modes identification may refer to identifying characteristics of the power system using the characteristics of the event. For example, a ringdown event may indicate the damping characteristics (e.g., underdamped, overdamped, etc.) of the power system at a given frequency, which may provide information regarding how the power system responds given an input into the power system.

Different ringdown analysis techniques may be performed on a given signal. For example, one technique of determining that a ringdown has occurred is by running recursive prony on a preprocessed signal. Based on the preprocessed signal and the recursive prony estimates, a statistical and logical detector may be used to detect an occurrence of a ringdown. Note that, while recursive prony is described in detail below, this is merely meant to be illustrative of one technique in performing ringdown analysis, and any other suitable method of ringdown analysis may be used.

Figure 3:
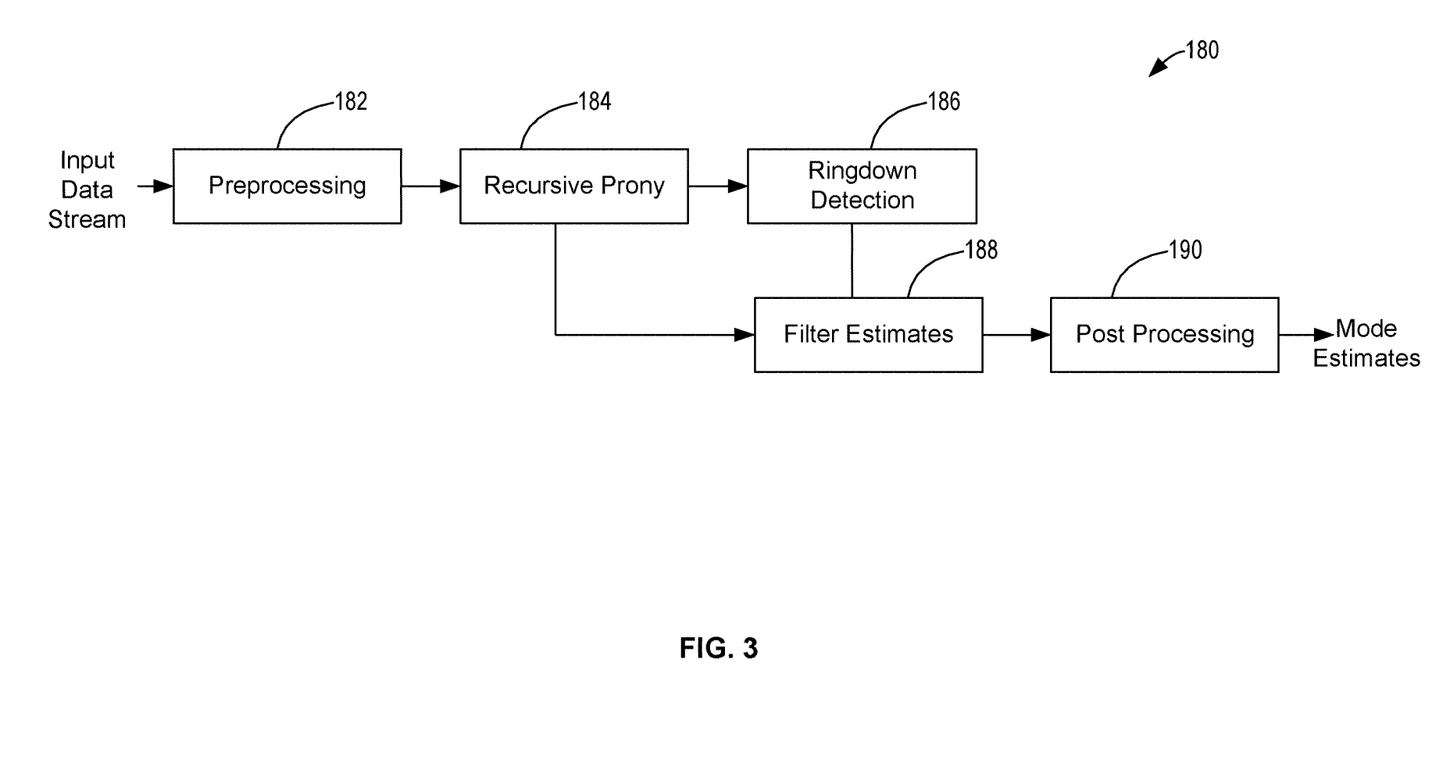
FIG. 3 is a flow diagram of a process performed by the IED of FIG. 1 to generate mode estimates based on the electrical measurements, in accordance with an embodiment.

FIG. 3 is a block diagram of a process 180 performed by the processor 100 of the IED 40 to perform ringdown analysis, in accordance with an embodiment. The IED 40 may receive an input data stream of electrical measurements, such as voltage measurements, current measurements, and the like, from the sensors. The IED 40 may perform preprocessing (block 182) on the electrical measurements. Preprocessing may include filtering the electrical measurements for undesired data, such as missing data and outliers detected in the data stream and replacing the missing data/outliers with a previous valid sample. The preprocessing may include a forward difference calculation. The IED 40 may perform median filtering (e.g., 3 sample median filtering) to filter spikes (due to sudden changes in the measurements) in the difference signal. The preprocessing may include low pass filtering of the electrical measurements via an equiripple FIR low pass filter with a cutoff frequency. The IED 40 may further perform decimation in which the electrical measurements are decimated by downsampling to a set number of samples (e.g., 5 samples per second, 10 samples per second, etc.)

The process 180 may continue by performing recursive prony (block 184) on the preprocessed electrical measurements. As mentioned above, while recursive prony is used as an example of a technique in equations 1-22, any other suitable method of ringdown mode estimation may be used. Consider the synchrophasor measurements:

$$\hat{y}[n], n=0,1,\ldots,n_s, n_s+1, n_s+2, \ldots, n_s+N-1, \ldots \quad (1)$$

where $\hat{y}[n]$ is the synchrophasor measurement at a given time n, $n_s$ is the start of the ringdown signal, and N is the length of the ringdown data window for Prony estimates.

The ringdown response in the syncrophasor measurements may be modeled as $$y[n] = \sum_{i=1}^{n_\lambda} B_i Z_i^{n-n_s}, \; n = n_S, n_s+1, n_s+2, \ldots, n_s+N-1 \quad (2)$$

where the Prony order is L, N>>L. For n≥N−1 such that $n_s$=n−N+1, the recursive Prony estimation may be formulated according to the following:

$$\begin{bmatrix} \hat{y}[n-N+L+1] \\ \hat{y}[n-N+L+2] \\ \vdots \\ \hat{y}[n-1] \\ \hat{y}[n] \end{bmatrix} = \quad (3)$$

$$\begin{bmatrix} \hat{y}[n-N+L] & \hat{y}[n-N+L-1] & \ldots & \hat{y}[n-N+1] \\ \hat{y}[n-N+L+1] & \hat{y}[n-N+L-2] & \ldots & \hat{y}[n-N+2] \\ \vdots & \vdots & \vdots & \vdots \\ \hat{y}[n-2] & \hat{y}[n-3] & \vdots & \hat{y}[n-L+1] \\ \hat{y}[n-1] & \hat{y}[n-2] & \ldots & \hat{y}[n-L] \end{bmatrix} \begin{bmatrix} \hat{a}_1 \\ \hat{a}_2 \\ \vdots \\ \hat{a}_{L-1} \\ \hat{a}_L \end{bmatrix}$$

$$\hat{Y}[n] = \begin{bmatrix} \hat{\phi}^T[n-N+L] \\ \hat{\phi}^T[n-N+L+1] \\ \vdots \\ \hat{\phi}^T[n-2] \\ \hat{\phi}^T[n-1] \end{bmatrix} \begin{bmatrix} \hat{a}_1 \\ \hat{a}_2 \\ \vdots \\ \hat{a}_{L-1} \\ \hat{a}_L \end{bmatrix} \quad (4)$$

$$\hat{Y}[n] = H[n]\hat{\theta}[n] \quad (5)$$

where each row in equation (3) gives an equation to solve unknown polynomial coefficients $\hat{a}_i$s, $\hat{y}[x]$ is an electrical measurement at time x, $\phi^T$ is the transpose of the corresponding row of electrical measurements $\hat{y}[x]$ in equation (3), H[n] is a matrix containing the $\phi^T$ columns, and $\hat{\theta}[n]$ is the column vectors of the $\hat{a}_i$s of equation (4).

The least square solution at the nth sample:

$$\hat{\theta}[n]=(H^T[n]\Lambda H[n])^{-1}H^T[n]\Lambda \hat{Y}[n] \quad (6)$$

$$\hat{\theta}[n]=\Phi^{-1}[n]S[n] \quad (7)$$

where Λ is a diagonalized matrix of eigenvalues (λ), Φ is given recursively by equation (8), and S is given recursively by equation (9).

Re-writing the terms for recursion:

$$\Phi[n] = H^T[n]\Lambda H[n] \quad (8)$$
$$= \lambda\Phi[n-1] + \hat{\phi}[n-1]\hat{\phi}^T[n-1] -$$
$$\lambda^{N-L}\hat{\phi}[n-N+L-1]\hat{\phi}^T[n-N+L-1]$$

$$S[n] = H^T[n]\Lambda \hat{Y}[n] \quad (9)$$
$$= \lambda S[n-1] + \hat{\phi}[n-1]\hat{y}[n] -$$
$$\lambda^{N-L}\hat{\phi}[n-N+L-1]\hat{y}[n-N+L]$$

Recursive estimates of the parameters may be given as:

$$\hat{\theta}[n]=\hat{\theta}[n-1]+\Phi^{-1}[n]\hat{\phi}[n-1]\{\hat{y}[n]-\hat{\phi}^T[n-1]\hat{\theta}[n-1]\}- \\ \lambda^{N-L}\Phi^{-1}[n]\hat{\phi}[n-N+L-1]\{\hat{\theta}[n-N+L-1]\hat{\theta}[n-1]\} \quad (10)$$

$$\hat{\theta}[n]=\hat{\theta}[n-1]+\Phi^{-1}[n]\hat{\phi}[n-1]\epsilon[n]-\lambda^{N-L}\Phi^{-1}[n]\hat{\phi}[n-N+ \\ L-1]\{\hat{y}[n-N+L]-\hat{\phi}^T[n-N+L-1]\hat{\theta}[n-1]\} \quad (11)$$

where $\epsilon[n]$ is apriori prediction error before the ringdown model is updated for new measurements.

Let P[n] be given as:

$$P[n]=\Phi^{-1}[n] \quad (12)$$

Given the matrix inversion lemma $$[A+BCD]^{-1}=A^{-1}-A^{-1}B[DA^{-1}B+C^{-1}]DA^{-1} \quad (13)$$

Using the lemma:

$$P[n] = Q[n] - \frac{Q[n]\hat{\phi}[n-1]\hat{\phi}^T[n-1]Q[n]}{1+\hat{\phi}^T[n-1]Q[n]\hat{\phi}[n-1]} \quad (14)$$

where Q[n] is given as:

$$Q[n]=\{\lambda\Phi[n-1]-\lambda^{N-L}\hat{\phi}[n-N+L-1]\hat{Y}^T[n-N+L-1]\}^{-1} \quad (15)$$

In terms of P[n], Q[n] is given as:

$$Q[n] = \frac{1}{\lambda}\left\{P[n-1] - \frac{P[n-1]\hat{\phi}[n-N-L-1]}{-\lambda^{-N+L-1}+\hat{\phi}^T[n-N+L-1]P[n-1]}\right\} \quad (16)$$

From $\hat{\theta}[n]$, z-domain modes may be estimated as roots of the polynomial of equation (17):

$$\hat{z}^L-(a_1\hat{z}^{L-1}+a_2\hat{z}^{L-2}+\ldots+a_L\hat{z}^0)=0 \quad (17)$$

S-domain modes may be estimated from the z-domain modes according to equation (18):

$$\hat{s}_i = \frac{1}{T_s}\ln(\hat{z}_i), \; i=1,2,\ldots,L \quad (18)$$

where $T_S$ is the sampling time period of the measurements in (1) and $z_i$ is the z-domain mode estimates of the ith mode in discrete time from the electrical measurements.

$B_i$ may be estimated values using the following least-square formulation $$\begin{bmatrix} \hat{z}_1^0 & \hat{z}_2^0 & \ldots & \hat{z}_L^0 \\ \hat{z}_1^1 & \hat{z}_2^1 & \ldots & \hat{z}_L^1 \\ \vdots & \vdots & \ldots & \vdots \\ \hat{z}_1^{N-1} & \hat{z}_2^{N-1} & \ldots & \hat{z}_L^{N-1} \end{bmatrix} \begin{bmatrix} \hat{B}_1 \\ \hat{B}_2 \\ \vdots \\ \hat{B}_L \end{bmatrix} = \begin{bmatrix} \hat{y}[n-N+1] \\ \hat{y}[n-N+1] \\ \vdots \\ \hat{y}[n] \end{bmatrix} \quad (19)$$

$$\hat{Z}\hat{\beta} = \hat{Y}_r \quad (20)$$

where $\hat{Z}$ is the matrix of $\hat{z}_m^i$ elements of the mth mode for the ith power.

The least-square solution may be given as:

$$\hat{\beta}=(\hat{Z}^T\hat{Z})^{-1}\hat{Z}^T\hat{Y}_r \quad (21)$$

where $\hat{\beta}$ is a vector column of the coefficients of the equations, and $\hat{Z}$ is a matrix of the roots of the characteristic equations of the polynomial.

A reconstructed measurement window may be given as:

$$\tilde{y}[m] = \sum_{i=1}^{L} \hat{B}_i \hat{Z}_i^{m-n_s}, \quad m = n_s, n_s+1, n_s+2, \ldots, n_s+N-1 \quad (22)$$

where $\tilde{y}$ is a reconstruction of the measurement window, also referred to herein as a ringdown model. The ringdown model may indicate a set of expected values in the measurement window of the what the measurements would be if there is a ringdown event on the power system. The recursive prony process may be used to perform ringdown detection (block 186) and to analyze mode estimates of the ringdown following filtering and post processing (blocks 188 and 190).

Figure 4:
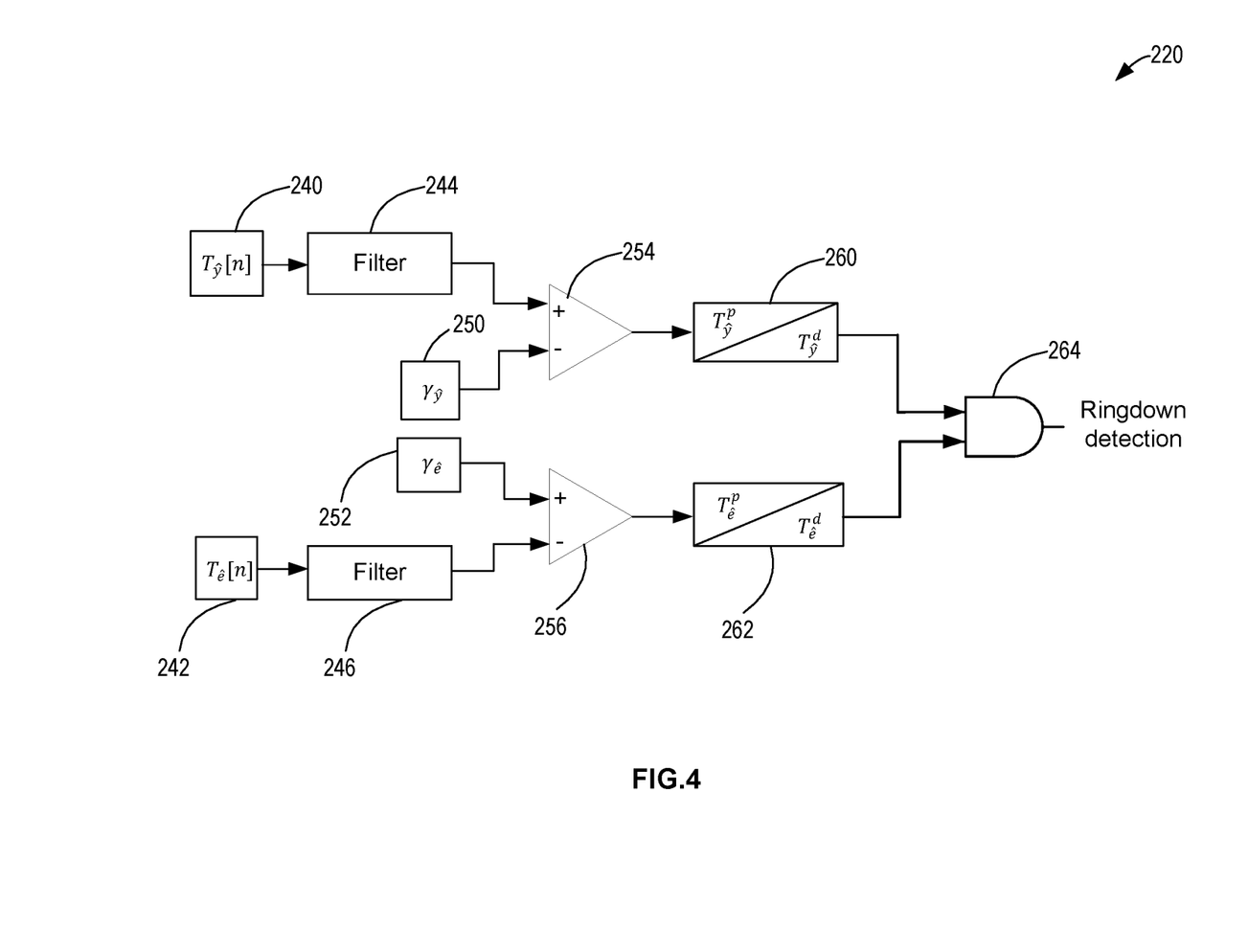
FIG. 4 is a logic diagram of a process to determine that a ringdown event has occurred on the power system of FIG. 1, in accordance with an embodiment.

FIG. 4 shows an example of a process 220 that may be performed by the IED 40 to perform ringdown detection (block 186). The reconstruction of the measurement window may be used with the electrical measurements of the power system to determine whether a ringdown event in fact occurred in the power system. For example, reconstruction error/noise may be determined using equation (23):

$$\hat{e}[m] = \tilde{y}[m] - \tilde{y}[m], \quad m = n_s, n_s+1, n_s+2, \ldots, n_s+N-1 \quad (23)$$

That is, the IED 40 may compare each electrical measurement at time m within the measurement window to a corresponding ringdown model estimated value ($\tilde{y}[m]$) at time m of the reconstruction of the measurement window to determine an error value at each time m. The error values may each be a difference between the expected value from the ringdown model of what the measurements would be if there were a ringdown and the electrical measurements actually obtained from the power system. The error values ê[m] (i.e., difference values) between the ringdown model and the electrical measurements may be summed to determine a total error value.

A full Prony window reconstruction noise energy may be defined as:

$$\hat{E}_{\hat{e}_N}[n] = \sum_{j=n-N+1}^{n} |\hat{e}[j]|^2 \quad (24)$$

where ê[j] is the error or noise between the electrical measurements and the ringdown model, N is the number of electrical measurements in the ringdown window, and n is the set of ringdown samples.

Fractional Prony window reconstruction noise energies may be defined as:

$$\hat{E}_{\hat{e}_L}[n] = \sum_{j=n-L+1}^{n} |\hat{e}[j]|^2 \quad (25)$$

$$\hat{E}_{\hat{e}_{N-L}}[n] = \sum_{j=n-N+1}^{n-L} |\hat{e}[j]|^2 \quad (26)$$

where L is a preset value that divides the window into a first set of estimated values and a second set of estimated values. The partitioned sets of estimated values may be used to scale (e.g., normalize) the energy values to a common level.

As mentioned above, some signals may not be appropriate for ringdown analysis. For example, the results of the comparison between the ringdown model with the electrical measurements may depend on the window selected. An event other than a ringdown may indicate certain electrical characteristics of the power system that are appropriate (e.g., inaccurate or unrelated) for determination during a ringdown event but not otherwise appropriate for use.

To select a measurement window of electrical measurements appropriate for ringdown analysis in which a ringdown event may have occurred, the IED 40 may detect potential ringdown events by comparing a first energy value of a first set of the electrical measurements with a second energy value of a second set of the electrical measurements. The IED 40 may then confirm whether the potential ringdown event is in fact a ringdown event based on the error calculation of equation (23).

A full prony window measurement energy may be defined as:

$$\hat{E}_{\tilde{y}_N}[n] = \sum_{j=n-N+1}^{n} |\tilde{y}[j]|^2 \quad (27)$$

Similarly, fractional prony window measurement energies may be defined as:

$$\hat{E}_{\tilde{y}_L}[n] = \sum_{j=n-L+1}^{n} |\tilde{y}[j]|^2 \quad (28)$$

$$\hat{E}_{\tilde{y}_{N-L}}[n] = \sum_{j=n-N+1}^{n-L} |\tilde{y}[j]|^2 \quad (29)$$

The IED 40 may determine test statistics based on the measurement energy (block 240) as:

$$T_{\tilde{y}}[n] = \frac{\hat{E}_{\tilde{y}_L}[n]}{\hat{E}_{\tilde{y}_N}[n]} = \frac{\hat{E}_{\tilde{y}_L}[n]}{\hat{E}_{\tilde{y}_L}[n] + \hat{E}_{\tilde{y}_{N-L}}[n]} \quad (30)$$

That is, $T_{\tilde{y}}[n]$ is a scaled energy test value of the sum of the first set of energy values divided by the sum of the total set of energy values (both the first and second set of energy values). For instance, when there is no ringdown event, the sum of the first set of energy values of equation (28) may be approximately proportional to the number of measurements within the first set of energy values compared to the total set of energy values. When there is a ringdown event within the first set of energy values, the sum of the first set of energy values may be comparatively greater than approximately proportional. As an example, if the first set of energy values has thirty samples and the first set of energy values (15 samples) is divided evenly from the second set of energy values (15 samples), the first set of energy values may be approximately half of the total energy. During a ringdown event, the sum of the first set of energy values may be greater than a threshold (e.g., 90 percent, etc.) of the sum of the total set of energy values indicating that a high energy event has occurred.

The IED 40 may determine test statistics based on reconstruction noise energy (block 242) as:

$$T_{\hat{e}}[n] = \frac{\hat{E}_{\hat{e}_L}[n]}{\hat{E}_{\hat{e}_N}[n]} = \frac{\hat{E}_{\hat{e}_L}[n]}{\hat{E}_{\hat{e}_L}[n] + \hat{E}_{\hat{e}_{N-L}}[n]} \quad (31)$$

That is, $T_ê[n]$ is a scaled error test value of the sum of the first set of noise energy values divided by the sum of the total set of noise energy values (both the first and second set of noise energy values). For example, when the ringdown model matches the electrical measurements, the scaled error test value may be comparatively lower than when the ringdown model does not match the electrical measurements due to lower error values indicating. That is, the second set of values may be used as a reference to scale the scaled error test value and the scaled energy test value. By using scaled quantities that are scaled to a reference of normal operation, the processes herein may be used with different signals. For instance, the IED 40 may use voltages, currents, power, or any other electrical measurements suitable for ringdown analysis, as well as different scales, such as high voltage, low voltage, high current, low current, and the like, due to scaling the quantities.

The IED 40 may detect a potential ringdown event when:

$$T_ŷ[n] > \gamma_ŷ \quad (32)$$

where $\gamma_ŷ$ is a scaled energy preset threshold that is set for a specified level of probability to ensure that the energy level indicates a potential ringdown event. Since the detector $T_ŷ[n]$ may be sensitive to events other than ringdown events, another detector may be used to gain confidence on the presence of a ringdown event. For example, equation (33) may be used to confirm the potential ringdown event is in fact a ringdown event:

$$T_ê[n] < \gamma_ê \quad (33)$$

where $\gamma_e$ is a scaled error preset threshold that is set for a specified level of probability to reduce false alarms. Since $0 \leq \eta_ŷ[n] \leq 1$ and $0 \leq \eta_ê[n] \leq 1$, $\gamma_ŷ$ and $\gamma_e$ can be within [0, 1] which is independent of the type of signals and the signal values. For example, when the ringdown model matches the electrical measurements, the scaled error test value due may be comparatively lower than when the ringdown model does not match the electrical measurements due to lower error values Returning to FIG. 4, the scaled test energy value $T_ŷ[n]$ (block 240) and the scaled error test value $T_ê[n]$ (block 242) may be filtered (blocks 244 and 246) to reduce noise in the measurements. For example, a 5-sample moving average filter may be used to smooth out $T_ŷ[n]$ and $T_ê[n]$. The scaled test energy value and the scaled test error value may be compared to the corresponding preset values $\gamma_ŷ$ (block 250) and $\gamma_e$ (block 252) at the corresponding comparators 254 and 256.

There may be a time delay in between the detections using equations (32) and (33). Equation (32) may pick up first and then equation (33). In the illustrated embodiment, pick-up and drop-out timers (blocks 260 and 262) are set independently. A ringdown may be detected when both test statistics (i.e., scaled energy test value and a scaled test error value) pick up at AND gate 264. By limiting ringdown detection to when both test statistics pick up, the IED 40 may provide mode estimates from ringdown events in real time (e.g., within 5, 10, or 20 cycles, etc. of the ringdown event) and while the IED 40 is online.

Returning to FIG. 3, upon detection of ringdown (block 186) from the process 220, the estimated modes are filtered (block 188). The IED 40 may filter by modal energy. For example, the energy of mth mode is calculated according to:

$$E_m = \sum_{i=0}^{N-1} \text{Real}\{B_m * z_m^i\}^{\wedge}2 \quad (33)$$

The modes may be sorted from highest to lowest modal energies and each of the modes that contribute to a cumulative energy of a preset amount (e.g., 90%, 95%, 99%, etc.) of the total modal energy may be stored in the memory of the IED 40. Filtered modes from may then be filtered by amplitude to keep the modes having an amplitude within [5% 500%] of the max (e.g., abs({ŷ[n]: n=$n_s$, $n_s$+1, $n_s$+2, . . . , $n_s$+N−1})). Following amplitude filtering, the IED 40 may then filter modes by frequency to retain the modes within [0.01 1.9] Hz. Following frequency filtering, the IED 40 may filter modes by damping range to keep the modes within [−inf, 30%] damping range.

The IED 40 may then perform post processing 190 to generate the mode estimates (block 190). The IED 40 may then generate the mode estimates of the power system based on the ringdown event. The mode estimates may include amplitude, frequency, damping constant, damping ratio, phase angle, or any other suitable estimated values.

The IED 40 may then send a signal indicating the mode estimates. In some embodiments, the signal indicating the mode estimates may be sent to a display to notify an operator, to another IED 40 (e.g., via the communication circuitry 112), or to decision logic on the IED 40 to perform control or monitoring operations. For example, the IED 40 may send the mode estimates to decision logic to determine that the power system has exceeded thresholds set related to stability of the power system. The IED 40 may then communicate the stability information to an operator to notify the operator of the state of the power system.

Figure 5:
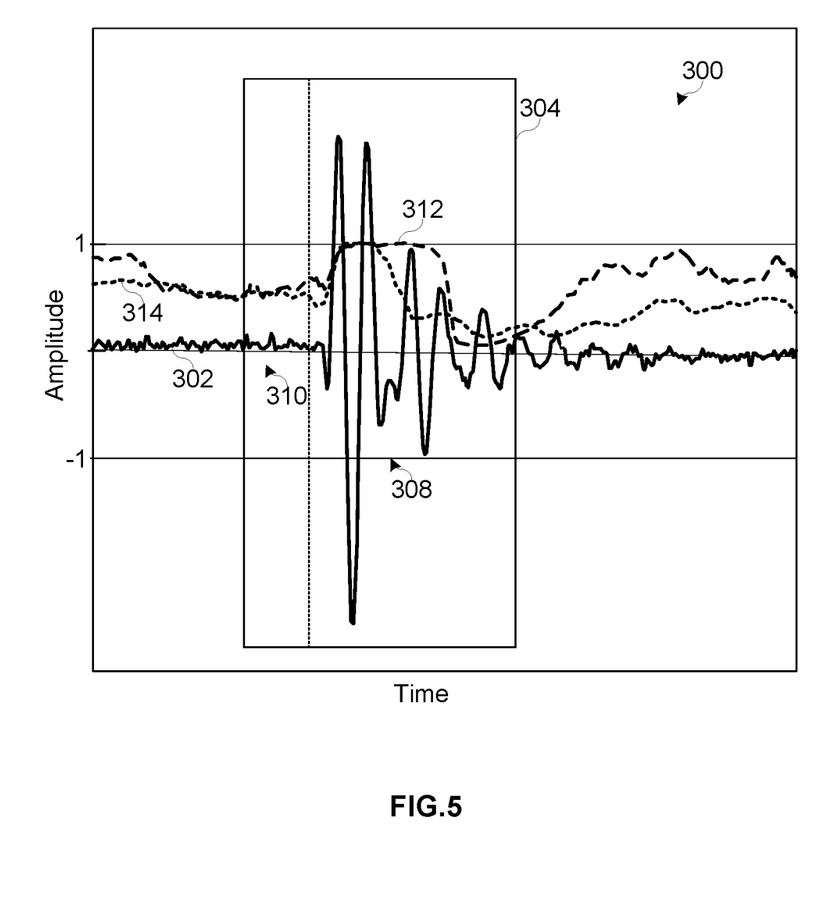
FIG. 5 is a plot of electrical measurements of a ringdown event that may be detected using the logic of FIG. 4, in accordance with an embodiment.
Figure 6:
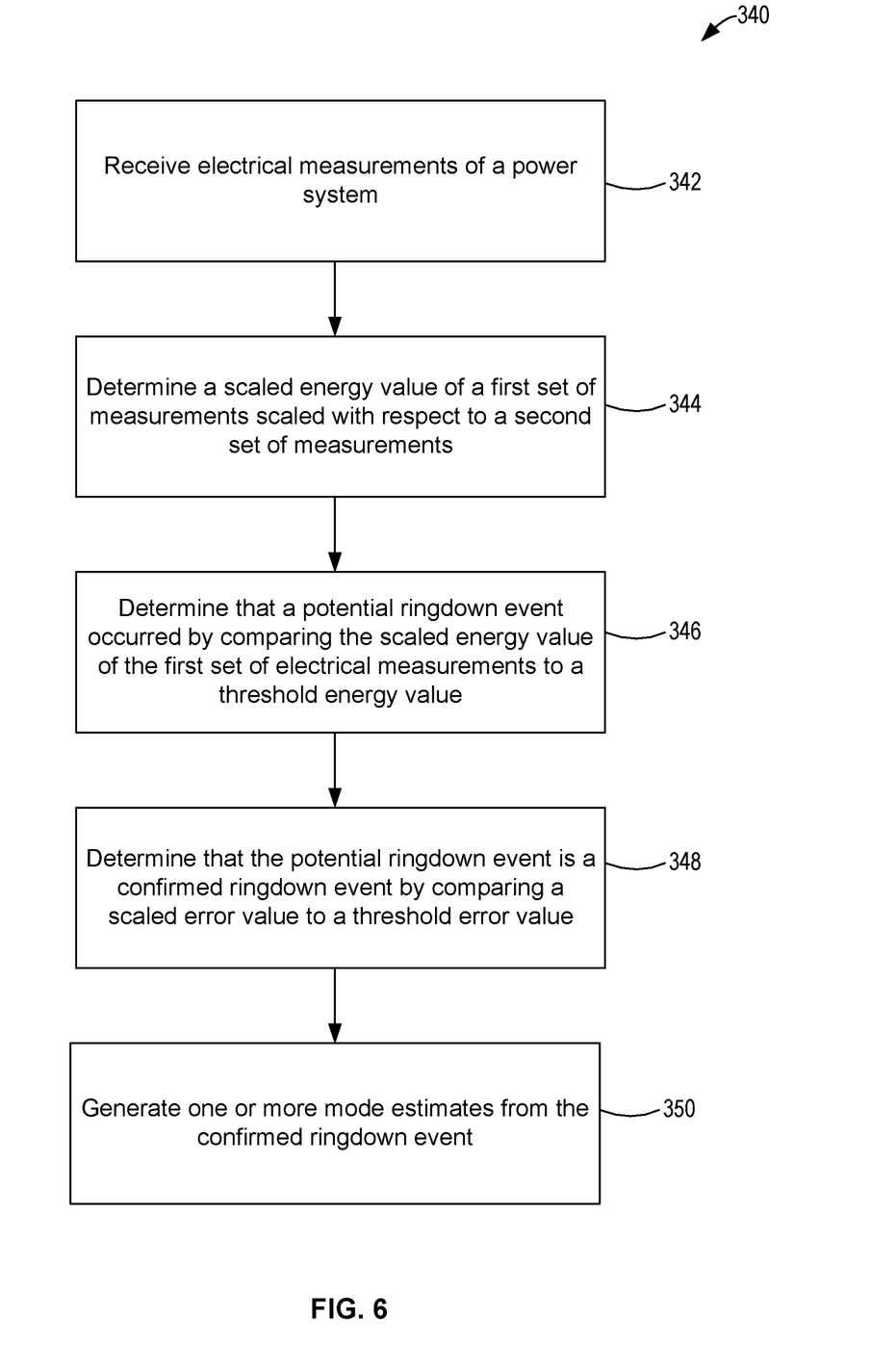
FIG. 6 is a flow diagram of an example of a process performed by the IED when monitoring the electrical measurements obtained in the plot of FIG. 5, in accordance with an embodiment.

FIG. 5 is a plot 300 of electrical measurements 302 that may be obtained by the IED 40 during a ringdown event in the power system. FIG. 6 is a flow diagram of a process 340 that may be performed by the IED 40 that is described in conjunction with FIG. 5 to generate the mode estimates of the power system. While the IED 40 is online monitoring the power system, the IED 40 may receive the electrical measurements via the sensors (block 342). The IED 40 may perform the ringdown analysis using the electrical measurements within a measurement window 304. The electrical measurements may include voltage, current, power, or any other measurements suitable for ringdown analysis.

The IED 40 may determine a potential ringdown event by comparing a scaled energy value of a first set 308 of the electrical measurements that is scaled with respect to a second set 310 of electrical measurements (block 344). The IED 40 may receive a user input indicating the length of the measurement window 304 and a size of the first set 308 of measurements and the second set of measurements 310. The IED 40 may divide the window of the electrical measurements into the first set 308 and the second set 310 based the user settings. The IED 40 may then calculate fractional prony window measurement energies of the first set 308 of electrical measurements and the second set 310 of electrical measurements using equations (28) and (29) to determine a scaled energy test value ($T_ŷ[n]$) (shown as signal 312 of FIG. 5). The scaled test energy value may be compared to the scaled energy preset threshold to determine whether a potential ringdown event has occurred (block 346). As illustrated in FIG. 5, the scaled energy test value increases to higher values (e.g., close to one) when energy of the electrical measurements in the first set 308 is relatively greater as compared to energy of the electrical measurements in the second set 310.

The IED 40 may calculate fractional prony window reconstruction noise energies of the first set 308 of electrical measurements and the second set 310 of electrical measurements using equations (25) and (26) to determine a scaled error test value ($T_{\hat{e}}[n]$). The scaled test error value may be compared to the scaled error preset threshold to determine that the potential ringdown event is in fact a confirmed ringdown event (block 348). One minus the scaled error test value $T_{\hat{e}}[n]$ is shown as signal 314 in FIG. 5. When the scaled error test value of the first set 308 of electrical measurements decreases to be near zero (depicted as being approximately one in the $(1-T_{\hat{e}}[n])$ signal 314, a potential ringdown event is confirmed. The scaled error test value may be compared to the scaled error preset threshold to determine that the potential ringdown event is in fact a ringdown event. In other words, the IED 40 may calculate the scaled error test value $T_{\hat{e}}[n]$ from a first set 308 of noise energy values divided by the sum of the total set of noise energy values (both the first and second set of noise energy values). For example, when the ringdown model matches the electrical measurements, the scaled error test value may be comparatively lower than when the ringdown model does not match the electrical measurements.

The IED 40 may generate one or more mode estimates from the confirmed ringdown event (block 350). For example, the energy of different modes may be calculated using equation 33. The mode estimates may then be used by operators in monitoring the power system, such as ensuring the stability of the power system.

By selecting appropriate signals to perform modal analysis according to when energy is relatively greater compared to other times, the IED 40 may limit the signals on which modal analysis is performed to obtain more accurate mode estimates of the power system. Further, by scaling a first set of measurements based on a second set of measurements on the power system when obtaining the scaled error test value and the scaled energy test value, the IED 40 may select signals appropriate for modal analysis without a user entering fixed energy values while automatically accounting for use in different power systems, changes in the generation and loads of the power system during online monitoring, and different electrical measurements that may be used in the modal analysis.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A system, comprising:
a memory; and
a processor operatively coupled to the memory, wherein the processor is configured to:
   obtain electrical measurements of a power system;
   determine a scaled energy value of a first set of the electrical measurements that is scaled with respect to a second set of electrical measurements;
   determine that a potential ringdown event occurred by comparing the scaled energy value of the first set of electrical measurements to a threshold energy value;
   determining a scaled error value by comparing the electrical measurements to a ringdown model;
   determine that the potential ringdown event is a confirmed ringdown event by comparing the scaled error value to a threshold error value;
   generate one or more mode estimates from the confirmed ringdown event; and
   send a signal indicating the one or more mode estimates; and
a device to receive the mode estimates to determine that the power system has exceeded a reliability threshold and to open a circuit breaker to disconnect a portion of the power system.

2. The system of claim 1, wherein the at least one processor is configured to obtain the first set of electrical measurements and the second set of electrical measurements within a time window, wherein the first set of electrical measurements are obtained at a first portion of the time window and the second set of electrical measurements are obtained at a second portion of the time window, and wherein the time window corresponds to a length of the confirmed ringdown event.

3. The system of claim 1, wherein the first scaled energy value is determined as:

$$T_{\hat{y}}[n] = \frac{\hat{E}_{\hat{y}_L}[n]}{\hat{E}_{\hat{y}_L}[n] + \hat{E}_{\hat{y}_{N-L}}[n]}$$

where $\hat{E}_{\hat{y}_L}$ a first fractional prony window measurement energy value of the first set of measurements and $\hat{E}_{\hat{y}_{N-L}}$ second fractional prony window measurement energy value of the second set of measurements.

4. The system of claim 3, wherein the first fractional prony window measurement energy value and the second fractional prony window measurement energy value are determined as:

$$\hat{E}_{\hat{y}_L}[n] = \sum_{j=n-L+1}^{n} |\hat{y}[j]|^2$$

$$\hat{E}_{\hat{y}_{N-L}}[n] = \sum_{j=n-N+1}^{n-L} |\hat{y}[j]|^2$$

where $\hat{y}$ is an electrical measurement at time j, n is an index of the electrical measurements in which ringdown analysis is being performed, L is a preset value that partitions the first set of electrical measurements the second set of electrical measurements, and N is the total number of samples in the first set of electrical measurements and the second set of electrical measurements.

5. The system of claim 1, wherein the at least one processor is configured to determine that the potential ringdown event occurred when the scaled energy value exceeds a preset energy value as the threshold energy value.

6. The system of claim 1, wherein the at least one processor is configured to determine the scaled error value as:

$$T_{\hat{e}}[n] = \frac{\hat{E}_{\hat{e}_L}[n]}{\hat{E}_{\hat{e}_L}[n] + \hat{E}_{\hat{e}_{N-L}}[n]}$$

where $\hat{E}_{\hat{y}_L}$ a first fractional window reconstruction noise energy value of the first measurements and $\hat{E}_{\hat{y}_{N-L}}$ second fractional window reconstruction noise energy value of the second measurements, and n is an index of the electrical measurements in which ringdown analysis is being performed.

7. The system of claim 1, wherein the at least one processor is configured to filter the scaled energy value using a moving average filter to smooth the scaled energy value to reduce noise prior to comparing the scaled energy value with the threshold energy value.

8. The system of claim 1, wherein the at least one processor is configured to determine that the potential ringdown event is the confirmed ringdown event when the scaled error value falls below a preset threshold error value as the threshold error value, wherein the preset threshold error value corresponds to a confidence level that the potential ringdown event is in fact a confirmed ringdown event.

9. A non-transitory, computer readable medium, comprising instructions configured to be executed by one or more processors to cause operations comprising:
   obtaining electrical measurements of a power system;
   determining a scaled energy value of a first set of the electrical measurements that is scaled with respect to a second set of electrical measurements;
   determining that a potential ringdown event occurred by comparing the scaled energy value of the first set of electrical measurements to a threshold energy value;
   determining a scaled error value by comparing the electrical measurements to a ringdown model;
   determining that the potential ringdown event is a confirmed ringdown event by comparing the scaled error value to a threshold error value;
   generating one or more mode estimates from the confirmed ringdown event;
   sending a signal indicating the one or more mode estimates;
   determining that the power system has exceeded a reliability threshold using the generated one or more mode estimates; and
   opening a circuit breaker to disconnect a portion of the power system in response to determining that the power system has exceeded the reliability threshold.

10. The non-transitory, computer readable medium of claim 9, wherein the one or more mode estimates comprise a damping value indicating whether the power system is at least one of overdamped, underdamped, critically damped, or negatively damped.

11. The non-transitory, computer-readable medium of claim 9, wherein the electrical measurements comprise synchrophasor measurements having an amplitude and a phase.

12. The non-transitory, computer-readable medium of claim 9, wherein the first set of electrical measurements and the second set of electrical measurements are obtained within a rolling time window that rolls as additional electrical measurements are obtained.

13. The non-transitory, computer-readable medium of claim 9, wherein the first scaled energy value is determined as:

$$T_{\hat{y}}[n] = \frac{\hat{E}_{\hat{y}_L}[n]}{\hat{E}_{\hat{y}_L}[n] + \hat{E}_{\hat{y}_{N-L}}[n]}$$

where $\hat{E}_{\hat{y}_L}$ a first fractional prony window measurement energy value of the first set of measurements and $\hat{E}_{\hat{y}_{N-L}}$ second fractional prony window measurement energy value of the second set of measurements.

14. The non-transitory, computer-readable medium of claim 13, wherein the first fractional prony window measurement energy value and the second fractional prony window measurement energy value are determined as:

$$\hat{E}_{\hat{y}_L}[n] = \sum_{j=n-L+1}^{n} |\hat{y}[j]|^2 \text{ and}$$

$$\hat{E}_{\hat{y}_{N-L}}[n] = \sum_{j=n-N+1}^{n-L} |\hat{y}[j]|^2$$

where $\hat{y}$ is an electrical measurement at time j, n is an index of the electrical measurement in which ringdown analysis is being performed, L is a preset value that partitions the first set of electrical measurements and the second set of electrical measurements, and N is the total number of samples in the first set of electrical measurements and the second set of electrical measurements.

15. The non-transitory, computer-readable medium of claim 9, comprising instructions configured to be executed by the one or more processors to cause operations comprising sending the mode estimates to a display of an intelligent electronic device of the power system.

16. The non-transitory, computer-readable medium of claim 9, comprising instructions configured to be executed by the one or more processors to cause operations comprising determining the scaled error value as:

$$T_{\hat{e}}[n] = \frac{\hat{E}_{\hat{e}_L}[n]}{\hat{E}_{\hat{e}_L}[n] + \hat{E}_{\hat{e}_{N-L}}[n]}$$

where $\hat{E}_{\hat{y}_L}$ a first fractional window reconstruction noise energy value of the first measurements and $\hat{E}_{\hat{y}_{N-L}}$ second fractional window reconstruction noise energy value of the second measurements, and n is an index of the electrical measurements in which ringdown analysis is being performed.

17. A method, comprising:
   obtaining electrical measurements of a power system;
   selecting a potential ringdown event based at least in part on a scaled energy value obtained from the electrical measurements;
   determining a scaled error value by comparing the electrical measurements to a ringdown model;
   confirming that the potential ringdown event is in fact a confirmed ringdown event based at least in part on the scaled error value of the electrical measurements;
   generating one or more mode estimates from the confirmed ringdown event;
   sending a signal indicating the one or more mode estimates;
   determining that the power system has exceeded a reliability threshold using the generated one or more mode estimates; and
   opening a circuit breaker to disconnect a portion of the power system in response to determining that the power system has exceeded the reliability threshold.

18. The method of claim 17, comprising confirming detection of ringdown may be detected when both the scaled energy value and the scaled error value are picked up via a pick-up and drop-out timers.

19. The method of claim 18, wherein the pick-up and drop-out timers for the scaled energy value and the scaled error value are set independently of each other.

20. The method of claim 17, wherein detection of ringdown is performed online and in real-time.

\* \* \* \* \*